(12) United States Patent
Kim et al.

(10) Patent No.: US 7,985,982 B2
(45) Date of Patent: Jul. 26, 2011

(54) ETCHANT COMPOSITION, PATTERNING CONDUCTIVE LAYER AND MANUFACTURING FLAT PANEL, DISPLAY DEVICE USING THE SAME

(75) Inventors: Bong-Kyun Kim, Incheon (KR); Hong-Sick Park, Gyeonggi-do (KR); Jong-Hyun Choung, Gyeonggi-do (KR); Sun-Young Hong, Gyeonggi-do (KR); Ji-Sun Lee, Chungcheongnam-do (KR); Byeong-Jin Lee, Gyeonggi-do (KR); Kui-Jong Baek, Daejeon (KR); Tai-Hyung Rhee, Daejeon (KR); Yong-Sung Song, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 12/391,976

(22) Filed: Feb. 24, 2009

(65) Prior Publication Data
US 2009/0227075 A1  Sep. 10, 2009

(30) Foreign Application Priority Data

Mar. 5, 2008  (KR) .......................... 10-2008-0020352

(51) Int. Cl.
*H01L 21/84*  (2006.01)

(52) U.S. Cl. ................................. 257/151; 257/E21.485
(58) Field of Classification Search .................. 438/158, 438/151; 257/E21.704, E21.485
See application file for complete search history.

(56) References Cited

U.S. PATENT DOCUMENTS

| | | | |
|---|---|---|---|
| 7,357,878 B2 * | 4/2008 | Park et al. | .......... 216/91 |
| 7,605,091 B2 * | 10/2009 | Park et al. | .......... 438/754 |
| 2006/0094241 A1 * | 5/2006 | Park et al. | .......... 438/689 |

FOREIGN PATENT DOCUMENTS

| | | |
|---|---|---|
| KR | 1020060039631 A | 5/2006 |
| KR | 1020060066349 A | 6/2006 |
| KR | 1020060094934 A | 8/2006 |

* cited by examiner

*Primary Examiner* — Thao Le
(74) *Attorney, Agent, or Firm* — Innovation Counsel LLP

(57) ABSTRACT

An etchant composition that allows simplification and optimization of semiconductor manufacturing process is presented, along with a method of patterning a conductive layer using the etchant and a method of manufacturing a flat panel display using the etchant. The etchant includes nitric acid, phosphoric acid, acetic acid, and an acetate compound in addition to water.

3 Claims, 5 Drawing Sheets

ETCHANT COMPOSITION, PATTERNING CONDUCTIVE LAYER AND MANUFACTURING FLAT PANEL, DISPLAY DEVICE USING THE SAME

This application claims the benefit of Korean Patent Application No. 2008-0020352 filed in Korea on Mar. 5, 2008, which is hereby incorporated by reference for all purposes as if fully set forth herein.

BACKGROUND OF THE INVENTION

1. Field of the Invention

The present invention relates to an etchant composition, method of patterning a conductive layer, and manufacturing a flat panel display device using the same. More particularly, the present invention relates to an etchant composition for simultaneously etching aluminum, molybdenum, and aluminum alloy and methods of patterning a conductive layer and manufacturing a flat panel display device using the same.

2. Description of the Related Art

In the prior art, an etchant that includes phosphoric acid, nitric acid, acetic acid and water is typically used to etch aluminum-based conductive material. An additive could be added to the etchant. However, this conventional etchant has a number of disadvantages.

First, because of irregular surface reaction, accurate and fine pattern of conductive material couldn't be formed. After 24 hours, the nitric acid portion in the etchant shows a sharp fall in concentration, negatively affecting surface uniformity. Furthermore, tip phenomenon occurs quite frequently. In a tip phenomenon, some part of a metal that is supposed to be etched does not get. Due to these problems, productivity decreases.

If the etchant includes more than 5 weight % of nitric acid in the composition, tip phenomenon could be prevented. However, to produce an accurate, fine pattern in the conductive layer, excessive etching of the lateral part of the conductive material is minimized. Too much nitric acid in the etchant causes damage to photo-resist and accelerates lateral etching.

Especially, in case of a multi-layer structure composed of different conductive materials having different etching rates, the problem becomes more serious because each layer may have to be etched by a different etchant, the process for etching the multi-layer may use different etching equipment for each layer, and the etching process for each layer can not be conducted at the same time. As a consequence, etching process gets complicated and manufacturing cost and time increases. Even if the same etchant is used for etching the multi-layer structure, tip phenomenon could have due to different etching rate of each conductive material and galvanic effect, resulting in an etching quality that is not sufficiently high. For the above reasons, there are many challenges to etching a multi-layer structure in an efficient manner (e.g., with the same etchant for each layer).

These days, there is ever-increasing pressure to simplify and optimize manufacturing processes and pattern uniformity. For example, TFT panel manufacturing process has changed into 4 mask process from 5 mask process. Hence, it is a method of etching a multi-layer structure efficiently is desirable.

SUMMARY OF THE INVENTION

Accordingly, the present embodiment of invention is directed to a composition of a etchant for removing conductive materials and a manufacturing method of an array substrate using the same that substantially obviates one or more of the problems due to limitations and disadvantages of the related art.

An advantage of the present embodiment of invention is to provide an etchant composition capable of simplifying an etching process and minimizing manufacturing costs, and increasing productivity, and methods of patterning a conductive layer and manufacturing a flat panel display device using the same.

Additional features and advantages of the embodiment of invention will be set forth in the description which follows, and in part will be apparent from the description, or may be learned by practice of the invention. The objectives and other advantages of the invention will be realized and attained by the composition and method particularly pointed out in the written description and claims hereof as well as the appended drawings.

To achieve these and other advantages and in accordance with the purpose of the present embodiment of invention, as embodied and broadly described, an etchant composition includes a phosphoric acid, a nitric acid, an acetic acid, water and an additive, wherein the additive includes acetate compound.

In another aspect of the present invention, a method of patterning a conductive layer: providing a substrate; forming a conductive layer on the substrate, wherein the conductive layer is a single layer formed of at least one of Al, Al alloy, and Mo, or a multilayer thereof; forming a photoresist layer on the conductive layer; patterning the photoresist layer by photo exposure; and etching the conductive layer using the patterned photoresist layer as an etch mask, wherein an etchant composition used to etch the conductive layer includes a phosphoric acid, a nitric acid, an acetic acid, water and an additive, wherein the additive includes acetate compound.

In another aspect of the present invention, a method of manufacturing a flat panel display device includes: providing a substrate; forming a first conductive layer on the substrate; patterning the first conductive layer to form a gate electrode; forming a gate insulating layer on the gate electrode; forming a semiconductor layer on the gate insulating layer corresponding to the gate electrode; forming a second conductive layer on the semiconductor layer; patterning the second conductive layer to form source drain electrodes; forming a passivation layer to be electrically connected to the drain electrode through the contact hole; and patterning the third conductive layer to form a pixel electrode, wherein the gate electrode, the source/drain electrodes and the pixel electrode are patterned by using one same etchant composition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
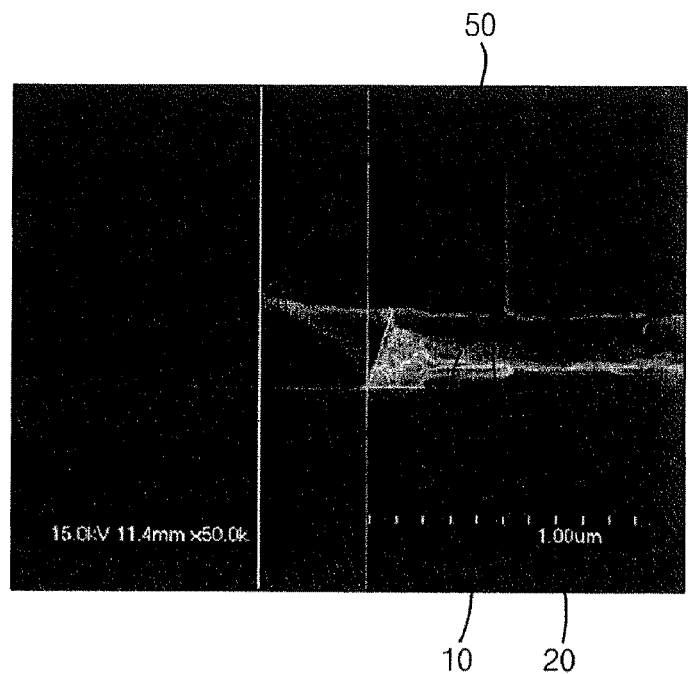
FIG. 1 is a scanning electron microscope (SEM) photograph illustrating a cross-section of multilayer of Mo/Al wet etched by an etchant.

Reference will now be made in detail to exemplary embodiments of the present invention, examples of which are illustrated in the accompanying drawings. Wherever possible, the same reference numbers will be used through out the drawings to refer to the same or similar parts.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

The embodiments of the present invention will be more fully illustrated through experimental examples and comparative examples. The experimental examples below are exemplified for illustrative purpose so that the present invention is not limited to these examples.

The etchant composition of the invention can be used in etching a conductive structure. The conductive structure could be either mono-layer or multi-layer. A mono-layer structure could be formed by a metal which is selected from molybdenum, aluminum, and aluminum alloy. The multi-layer structure could be formed with the above metals.

During an etching process, a chemical is provided on to the surface of a material to be etched. Material on the surface reacts with the chemical, and a soluble product is produced from the reaction. If this soluble product is taken out from the surface, a pattern is formed.

Now, the chemicals and their proper weight percent in the etchant will be explained.

The etchant includes phosphoric acid, nitric acid, acetic acid, water, and acetate compound. Proper weight percent of phosphoric acid is from about 50 weight % to about 77 weight percent. In case of nitric acid, proper weight percent is from about 2 weight % to about 5 weight %. Proper weight percent of acetic acid is from about 1 weight % to about 25 weight percent. And in case of acetate compound, proper percentage of acetate compound is from about 1 weight percent to about 10 weight percent. The remainder of the composition could be water.

Nitric acid reacts with aluminum to form oxide. About 2 weight percent to about 5 weight percent of nitric acid disclosed in this invention will be effective to control the selectivity in etching a multi-layer structure composed of different metals. When the content of the nitric acid is within the above-disclosed range, the nitric acid effectively controls the etching selectivity between an upper layer and a lower layer of the multi-layer structure.

Phosphoric acid plays a role in decomposing the aluminum oxide. About 50 weight percent to about 77 weight percent phosphoric acid will help to enhance the etching speed rapidly by decomposing the aluminum oxide effectively.

At this time, acetic acid and water is used to dilute the etchant. Acetic acid is also useful for controlling the speed of oxidation reaction. Generally, excessively fast decomposing speed will reduce the remaining time of a proper profile. Thus, proper composition of acetic acid and water is important in the etching process.

Acetate compound is formed by transforming a hydrogen ion of acetic acid into metal ion such as sodium ion, potassium ion, calcium ion and aluminum ion. And hydrogen ion of the acetic acid can be transformed by ammonium ion also. Most of acetate compound is dissolved into water and dissociated into metal ion and acetic ion. Generally, the chemical formula for an acetate salt is $M^n(CH_3COO)_n$ (wherein M is a metal. Sodium acetate and calcium acetate are salts that have this chemical formula. Chemical formula for an acidic salt is $M^n(CH_3COO)_n \cdot m(CH_3COOH)$. Chemical formula for a basic salt is $M^{III}(OH)(CH_3COO)_2$ ($M^{III}$:AlGa) and $M^{III}O(CH_3COO)$. The acetate compound controls the etching rate to minimize lateral etching of the conductive layer and the decomposition rate of nitric acid in the etchant to achieve a good profile of the metal layer's pattern.

Phosphoric acid, nitric acid, and water used in semiconductor process meet a requisite level of purity. In case of water, de-ionized water is used. If an etchant has a composition of the invention described herein, the amount of lateral etch can be minimized. Reducing the amount of lateral etch is a critical factor for fine patterning, and the invention allows a good control over the lateral etch to achieve this goal.

If phosphoric acid makes up over 77 weight percent of the etchant, the high viscosity of phosphoric acid will damage the etching equipment. For example, the sprayer that is used for spraying the phosphoric acid may not work well. On the other hand, if phosphoric acid makes up less than 55 weight percent of the etchant, it may not decompose the oxide on surface enough, and therefore fail to achieve the intended etching profile. For these reasons, phosphoric acid between about 55 weight percent and about 77 weight percent is preferable.

If nitric acid makes up over 5 weight percent of the etchant, it may damage the photo-resist layer, making it difficult to obtain the intended photo-resist pattern. Also, it results in excessive lateral etch of the conductive layer and cause electrical signal line open. On the other hand, if nitric acid makes up less than 2 weight percent of the etchant, it may not properly form the oxide layer on the surface of the metal to be etched, making it difficult to pattern the conductive layer.

If acetic acid makes up over 25 weight percent of the etchant, it destroys the photo-resist layer and interferes with the formation of the desired photo-resist pattern.

The acetate compound makes up between about 1 weight percent and about 10 weight percent of the etchant. If the acetate compound makes up over 10 weight percent of the etchant, it may cause problems due to high viscosity or excessive reduction in the etching rate. On the other hand, if the acetate compound makes up less than 1 weight percent, it may not sufficiently control the etching rate. Nitric acid is not only an oxidizing agent but also a weakening agent of the adhesiveness between the photo-resist and metal layer to be etched. The acetate compound controls the rate of oxidation-reduction reaction and prevents excessive weakening of the photo-resist adhesiveness. Further, it helps to prevent excessive lateral etching. That is to say, using the acetate compound within the range disclosed herein to control the etching rate will result in minimum of lateral etching and good patterning of metal layer. Moreover, because the acetate compound lowers the volatility of nitric acid, it can increase a life time of the etchant.

EXPERIMENTAL EXAMPLE

In this embodiment, a glass substrate having a width of 100 mm and length of 100 mm is used. Three metal structures are compared: a first structure that includes a molybdenum monolayer, a second structure including a molybdenum/aluminum bilayer, and a third structure including a molybdenum/aluminum/molybdenum triple layer.

TABLE 1

| | Layer | | |
|---|---|---|---|
| | Mo | Mo/Al | Mo/Al/Mo |
| thickness | 2500 Å | 500/2500 Å | 1000/2000/500 Å |

According to Table 1, the Mo mono layer is formed on the substrate with a thickness of 2500 Å. The Mo/Al bilayer is formed sequentially on the substrate with a respective thickness of 500 Å/2500 Å. In the particular example, the Mo layer is formed on the Al layer. In case of Mo/Al/Mo triple layer, the total thickness is 3500 Å. The aluminum layer in this embodiment of the invention can be either pure aluminum or an alloy.

Experiment 1~6

Fifteen kg of an etchant including phosphoric acid, nitric acid, acetic acid, acetate compound (KCH3COO, NH2CH3COO), and water is used. The etchant is provided into a spraying-type etching equipment. Temperature was maintained at 40±0.5 degrees Celsius. Etching method was spraying type, which sprays the etchant on the substrate. Etching time was over etch (O/E) 50% and 70% with a standard of EPD (End Point Detection). After completing etching, cleaning and drying process was conducted. With SEM, we checked the amount of lateral etching, taper angle, damage of photo-resist, and residue of etchant. The standard for evaluating is as follows: If the CD skew is below 0.5 μm when the over etching rate is 70%, the overall etch is regarded as Excellent; if The CD skew is between 0.5 μm and 0.6 μm, it is regarded as Good. The Tip phenomenon for the Mo layer on the top or the bottom layer have to be less than 0.03 μm in both of these cases. If the overall etch is evaluated as Fail, it means it doesn't have proper composition. If the composition is not evaluated as Excellent or Good, it is regarded as Fail. The CD skew refers to the difference between the width of the pattern after the photo-process, before etching and the width of actual pattern after etching. If the difference is large, it means the amount of lateral etch is big.

TABLE 2

| No. of Experiment | Metal layer | Acetate compound | Composition ratio (wt %) (phosphoric acid/nitric acid/acetic acid/acetate compound/DIW) | CD skew (μm) O/E 50% | CD skew (μm) O/E 70% | Taper Angle, ° O/E 50% | Taper Angle, ° O/E 70% | Evaluation |
|---|---|---|---|---|---|---|---|---|
| 1 | Mo | CH3COOK | 65/3.5/15.5/2.5/13.5 | no damage of PR | | | | |
| 2 | Mo/Al | | | 0.34 | 0.41 | 70.51 | 73.65 | Excellence |
| 3 | Mo/Al/Mo | | | 0.34 | 0.47 | 63.43 | 70.5 | Excellence |
| 4 | | | 53/4/13/3.5/27 | 0.38 | 0.56 | 61.86 | 59.66 | Good |
| 5 | | | 70/4/6/3.5/17 | 0.4 | 0.5 | 69.54 | 73.3 | |
| 6 | | CH3COONH4 | 73/5/6.7/1/14.27 | 0.40 | 0.56 | 62.45 | 67.75 | |
| 7 | Mo/Al | | | 0.41 | 0.54 | 62.65 | 72.72 | |

Comparative Experiment 1~4

After preparing 15 kg of etchant including phosphoric acid, nitric acid, acetic acid, acetate compound (KCH$_3$COO) and water, we evaluate the result of etching.

TABLE 3

| No. of Experiment | Metal layer | Acetate compound | Composition ratio (wt %) (phosphoric acid/nitric acid/acetic acid/acetate compound/DIW) | CD skew (μm) O/E 50% | CD skew (μm) O/E 70% | (Taper Angle, °) O/E 50% | (Taper Angle, °) O/E 70% | Evaluation |
|---|---|---|---|---|---|---|---|---|
| 1 | Mo | CH3COOK | 33/10/13/3/41 | Damage of Photoresist | | | | fail |
| 2 | Mo/Al/Mo | | | cannot etch | | | | fail |
| 3 | | | 63/7/13/3.7/14 | 0.66 | 0.88 | 58.09 | 52.21 | fail |
| 4 | | CH3COONH4 | 63.71/4.2/10.13/0/17.96 | 0.84 | 1.02 | 24.12 | 29.25 | fail |
| 5 | | | 63/1/13/3/20 | 0.38 | 0.52 | 50.08 | 56.31 | fail |

FIG. 1 is a scanning electron microscope (SEM) photographs illustrating a cross-section of multilayer of Mo/Al wet etched by an etchant.

FIG. 1 shows the result of embodiment 2 of table 2. The metal layer in this embodiment was molybdenum(20)/aluminum(10) bilayer. The composition of the etchant was 65 weight percent phosphoric acid, 3.5 weight percent nitric acid, 15.5 weight percent acetic acid, 2.5 weight percent acetate acid, and 13.5 weight percent water. The acetate compound used in this embodiment is potassium acetic acid ($CH_3COOK$). The CD skew (amount of lateral etching) is the difference between the line width before etching and the line width after etching. When the over-etching rate is 50 percent, CD skew is 0.34 μm. When the over etching rate is 70 percent, CD skew is 0.47 μm. Comparing to embodiment 3 of table 3, there is difference in the amount of phosphoric acid; in embodiment 3, phosphoric acid makes up only 33 weight percent of the etchant. In embodiment 3, however, the photoresist was damaged and it was impossible to etch for patterning. This is because less than 50 weight percent of phosphoric acid couldn't decompose the oxide surface sufficiently well. This result is Excellent by a evaluation standard. Beside, Tip phenomenon of top Mo layer (20) is not observed, and the taper angle is 73.65 degree. Thus, the etchant composition disclosed in this embodiment of the invention yielded superior etching result which makes possible to make a fine pattern.

Figure 2:
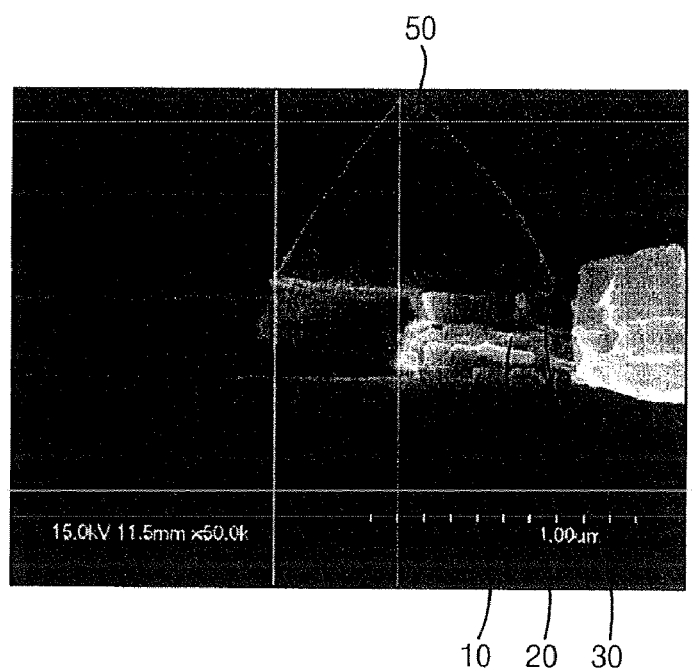
FIG. 2 is a scanning electron microscope (SEM) photograph illustrating a cross-section of multilayer of Mo/Al/Mo wet etched by an etchant.

FIG. 2 is a scanning electron microscope (SEM) photograph illustrating a cross-section of a Mo/Al/Mo structure wet etched by an etchant. The etch result is that of embodiment 3 of table 2. Molybdenum and aluminum layers are formed on the substrate sequentially. The composition of the etchant is 65 weight percent phosphoric acid, 3.5 weight percent nitric acid, 15.5 weight percent acetic acid, 2.5 weight percent acetate acid, and 13.5 weight percent water. Acetate compound used in this embodiment is potassium acetic acid ($CH_3COOK$). This embodiment was controlled under same condition like the embodiment 2. When over etching rate is 50 percent, CD skew is 0.34 μm. When over etching rate is 70 percent, CD skew is 0.41 μm. 0.34 CD skew is enough to make a fine pattern. This composition is evaluated as Excellent. And the Tip phenomenon of Mo layer (20,30) is less than 0.03 μm. Thus, this composition within a range disclosed in this embodiment of the invention is enough to make an accurate and fine pattern of conductive layer.

Figure 3:
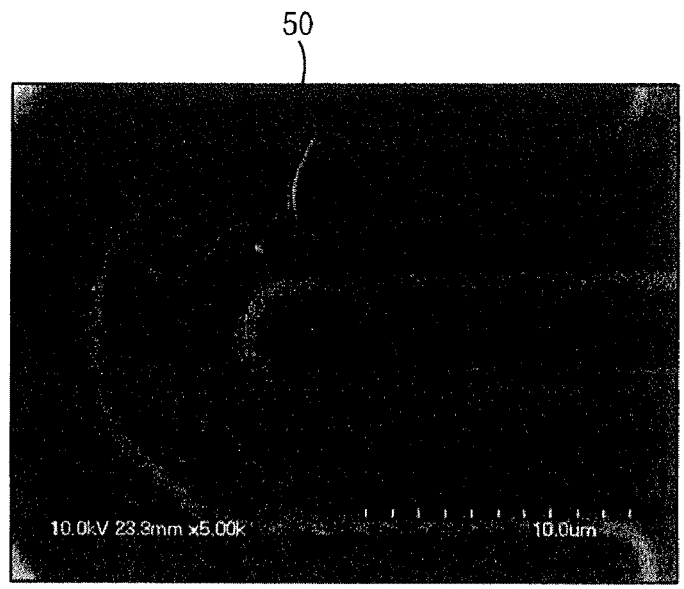
FIG. 3 is a scanning electron microscope (SEM) photograph illustrating a cross-section of multilayer of Mo/Al/Mo wet etched by an etchant including more than 10 weight % of nitric acid.

FIG. 3 is a scanning electron microscope (SEM) photograph illustrating a cross-section of Mo mono-layer wet etched by an etchant including more than 10 weight % of nitric acid. As we can observe through the figure, the photoresist (50) itself was damaged, so the pattern couldn't be formed at all. This figure shows the result yielded by using an etchant including more than 10 weight % of nitric acid. This figure is enough to prove that etchant including more than 5 weight percent of nitric acid is not suitable for etching.

Figure 4:
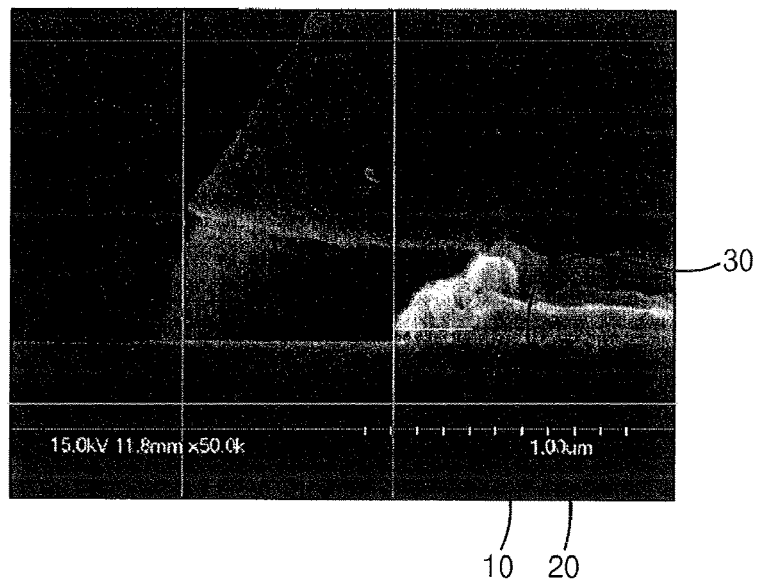
FIG. 4 is a scanning electron microscope (SEM) photograph illustrating a cross-section of single layer wet etched by an etchant including more than 7 weight % of nitric acid.

FIG. 4 is a scanning electron microscope (SEM) photograph illustrating a cross-section of single conductive layer wet etched by an etchant including more than 7 weight % of nitric acid. The result is on the comparative experiment 3 in Table 3. The target layer is Mo/Al/Mo layer. The acetate compound was $CH_3COOK$. The composition of phosphoric acid, nitric acid, acetic acid and water was 63, 7, 3.7, and 14 weight %, respectively. When the over etch rate was 70%, CD skew was 0.88 μm, which was beyond the standard. This is because too much nitric acid composition in the etchant caused difficulty in controlling the etching rate and increased CD skew.

Figure 5:
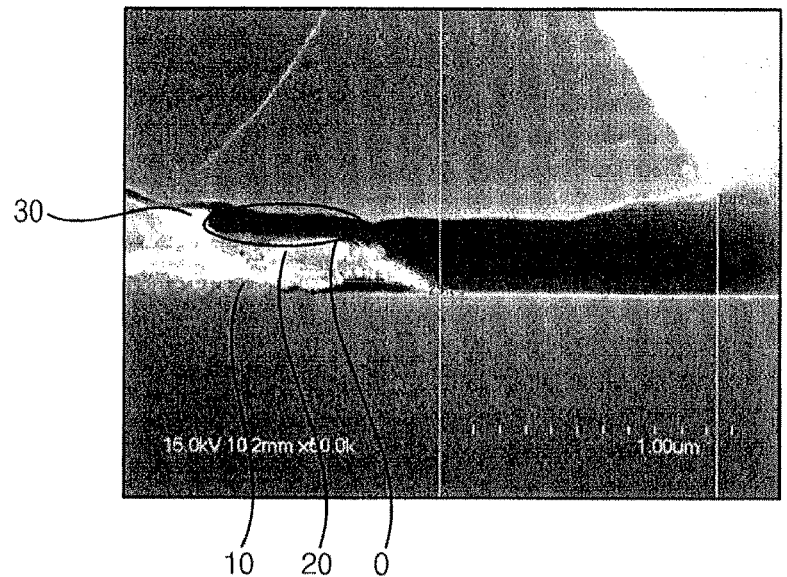
FIG. 5 is a scanning electron microscope (SEM) photograph illustrating a cross-section of layer of Mo/Al/Mo wet etched by an etchant without acetate compound.

FIG. 5 is a scanning electron microscope (SEM) photograph illustrating a cross-section of a Mo/Al/Mo structure wet etched by an etchant without an acetate compound. The result is shown on the compared experiment 4 in Table 3. In this experiment, the etchant didn't include an acetate compound at all. If the etchant doesn't include the acetate compound, it becomes too difficult to control the decomposing rate of nitric acid. Accordingly, excessive lateral etch happens, which results in 1.02 μm in 70% over etch. Absence of acetate compound results in failure of controlling of etching rate. This result shows that the acetate compound in the etchant composition as an essential component.

Figure 6:
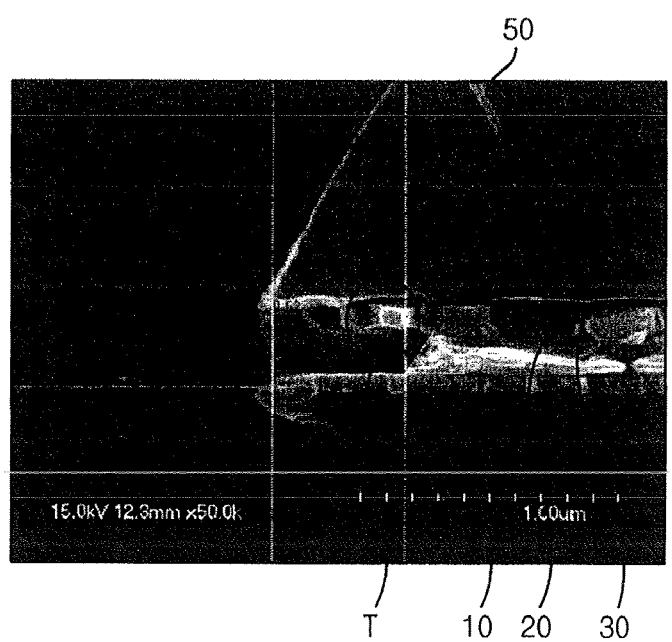
FIG. 6 is a scanning electron microscope (SEM) photograph illustrating a cross-section of layer of Mo/Al/Mo wet etched by and etchant including about 1 weight % of nitric acid.

FIG. 6 is a scanning electron microscope (SEM) photograph illustrating a cross-section of layer of Mo/Al/Mo wet etched by and etchant including about 1 weight % of nitric acid. The result satisfies the evaluation standard. But as we can observe from the figure, Mo layer on the aluminum layer is not etched enough, which results in Tip phenomenon. The nitric acid is less than 1 weight percent. In this composition, oxidation layer can't be formed enough to form the desired pattern. Based on this experiment it has been determined that the minimum nitric acid composition to achieve the fine pattern is about 2 weight percent.

Figure 7:
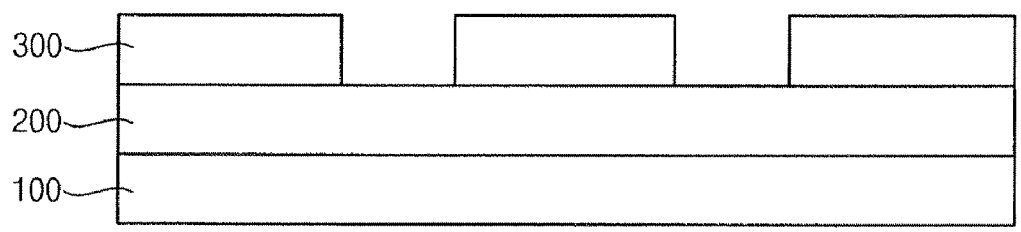
FIGS. 7, 8, and 9 are cross sectional views illustrating a method of patterning a conductive layer using an etchant composition according to an embodiment of the present invention.
Figure 8:
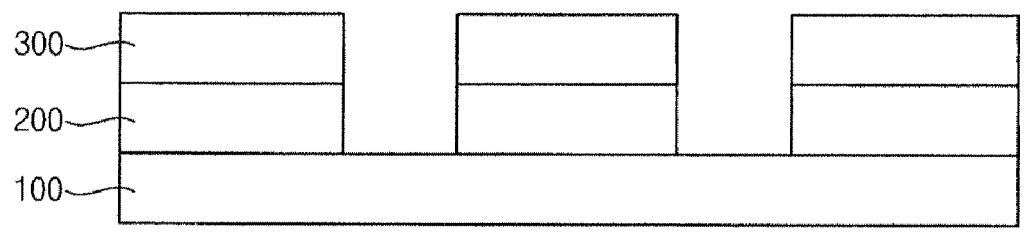
Figure 9:
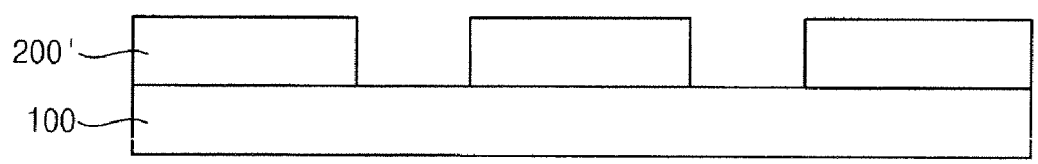

FIGS. 7, 8 and 9 are cross-sectional views illustrating a method of patterning a conductive layer using the etchant composition according to an embodiment of the present invention.

Referring to FIG. 7, a substrate (100) is provided. A conductive layer (200) is formed on the substrate. The conductive layer may be a single layer formed of at least one of aluminum (Al), molybdenum (Mo), and an aluminum alloy containing at least one of Nd (Neodymium), Ni (Nickel), Nb (Niobium), or a multilayer structure of these layers.

A photoresist layer may be formed on the conductive layer (200). Subsequently, an exposure mask (not shown) is aligned over the photoresist layer. The exposure mask has a predetermined shape corresponding to the pattern of a conductive pattern. Then, ultraviolet light is irradiated on the exposure mask. Then, the photoresist layer is patterned into the shape of the exposure mask. The photoresist layer may be a negative photoresist layer through which a non-irradiated portion is removed, or a positive photoresist layer through which an irradiated portion is removed. The substrate is dipped into a developer solution thereby forming a photoresist pattern (300) exposing a portion of the conductive layer.

Referring to FIG. 8, the exposed conductive layer by the photoresist pattern (300) is etched using an etchant so as to form a conductive pattern. The etchant composition includes a nitric acid of about 2 weight % to about 5 weight %; a phosphoric acid of about 50 weight % to about 77 weight %; an acetic acid of about 1 weight % to about 25 weight %; an acetate compound of about 1 weight % to about 10 weight %; and water of residual quantity.

Thereafter, as illustrated in FIG. 9, the photoresist pattern (300) is removed so that the conductive pattern (200') remains on the substrate.

Figure 10:
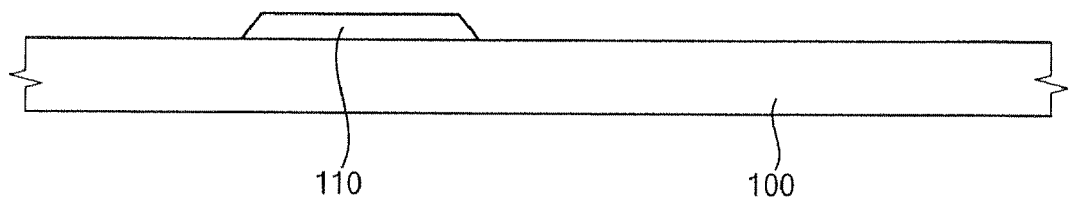
FIGS. 10, 11, and 12 are cross sectional views illustrating a method of manufacturing a flat panel display device according to an embodiment of the present invention.
Figure 11:
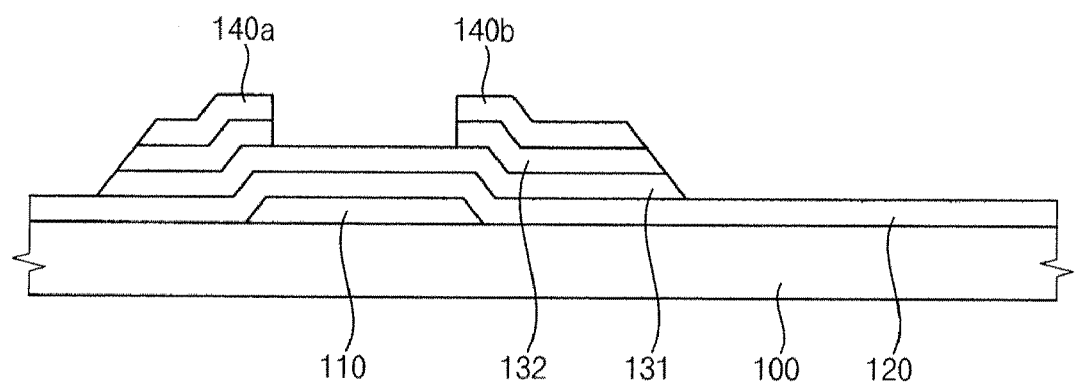
Figure 12:
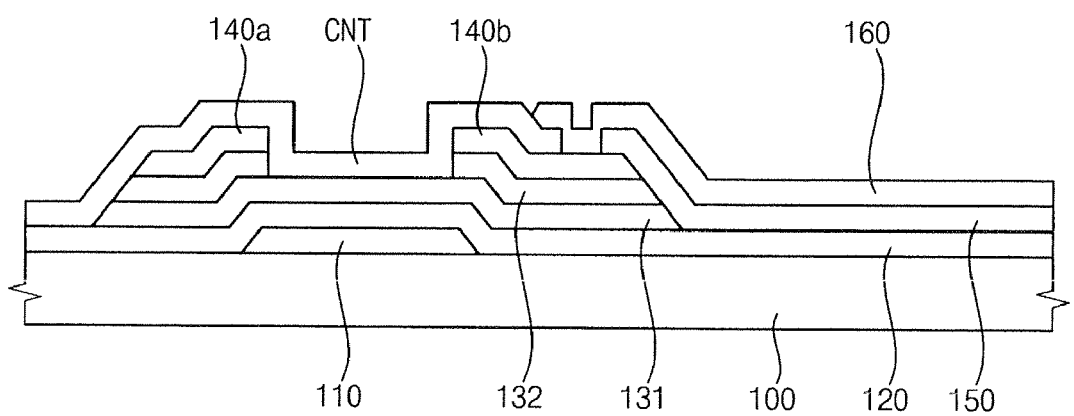

FIGS. 10, 11 and 12 are cross-sectional views illustrating a method of manufacturing a flat panel display device according to an embodiment of the present invention.

Referring to FIG. 10, a substrate (100) is prepared. The substrate may be formed of plastic, glass, or metal. A first conductive layer is formed on the substrate. The first conductive layer is patterned into a predetermined configuration to thereby form a gate interconnection (not shown) and a gate electrode. The first conductive layer may be a single layer formed of at least one of aluminum (Al), molybdenum (Mo), and an aluminum alloy containing at least one of Nd (Neodymium), Ni (Nickel), Nb (Niobium), or a multilayer structure containing the above. The gate interconnection and the gate electrode may be formed as a bilayer or triple layer structure in which the Mo layer and Al layer are stacked.

Referring to FIG. 11, a gate insulating layer (120) is formed on the gate interconnection and the gate electrode, wherein the gate insulating layer is formed of a silicon layer, a silicon nitride layer, or multilayer thereof. The gate insulating layer may be formed using chemical vapor deposition (CVD) or a sputtering process. For instance, the CVD process may be performed using at least one of low pressure CVD (LPCVD), atmospheric pressure CVD (APCVD), and plasma enhanced CVD (PECVD).

Thereafter, an active layer (131) and an ohmic layer (132) are stacked on the gate insulating layer (120) corresponding to the gate electrode so as to form a semiconductor layer configured with the active layer (131) and the ohmic layer (132). Herein, the active layer may be formed of amorphous silicon, and the ohmic contact layer may be formed of amorphous silicon doped with n-type or p-type impurities.

After a second conductive layer is formed on the semiconductor layer, it is patterned into a predetermined shape to thereby form a data interconnection (not shown) and source/drain electrodes (140). Herein, the second conductive layer may be a single layer formed of at least one of aluminum (Al), molybdenum (Mo), and an aluminum alloy containing at least one of Nd, Ni, Nb, or a multilayer structure including the above. The data interconnection and the source/drain electrodes may be formed of a Mo single layer.

Accordingly, a thin film transistor, configured with the gate electrode (110), the source/drain electrodes (140), and the semiconductor layer (130) is completed.

Referring to FIG. 12, a passivation layer (150) is formed on the data interconnection and the source/drain electrodes. Thereafter, a contact hole (CNT) is formed so as to expose a portion of the drain electrode. Herein, the passivation layer may be formed of silicon nitride, silicon oxide, and acryl-based compound.

Afterwards, a third conductive layer is formed on the passivation layer such that it is electrically connected to the drain electrode through the contact hole. Subsequently, the third conductive layer is patterned into a predetermined shape thereby forming a pixel electrode (160). The pixel electrode (160) may be formed of a transparent electrode, e.g., ITO or IZO.

Each of the gate electrode, the source/drain electrodes, and the pixel electrode may be patterned using the same etchant composition. The etchant composition may include a nitric acid of about 2 weight % to about 5 weight %; a phosphoric acid of about 50 weight % to about 77 weight %; an acetic acid of about 1 weight % to about 25 weight %; an acetate compound of about 1 weight % to about 10 weight %; and water of residual quantity.

Although a method of manufacturing a bottom gate type TFT is illustrated, the present invention, including the etchant composition, may be used to manufacture another type TFT such as a top gate type TFT or the like.

Thereafter, a flat panel display device may be fabricated according to well-known processes. For instance, if the flat panel display device is a liquid crystal display device (LCD), a liquid crystal is injected between a first substrate in which a color filter and a transparent electrode are disposed and a second substrate in which the TFT is formed, to thereby manufacture the LCD.

If the flat panel display device is an organic electroluminescence display device (OLED), another electrode is formed on an organic layer after forming the organic layer to include a luminescent layer on the pixel electrode, to thereby manufacture the OLED. Herein, the organic layer may further include a charge transport layer or a charge injection layer.

Therefore, even if the gate interconnection and gate electrode, the data interconnection and source/drain electrodes, and the pixel electrode are formed of different materials, they may be patterned using the same etchant composition. Therefore, processes may be simplified so that it is easy to manufacture the flat panel display device.

According to the present invention, because the etchant composition is capable of simultaneously etching aluminum, molybdenum, and ITO, all of the gate electrode, the source/drain electrodes, and the pixel electrode may be formed using the same etchant so that it is easy to control processing.

In addition, etching processes may be simplified so that it is possible to enhance productivity and reduce manufacturing costs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A composition of etchant, comprising:
nitric acid of about 2 weight % to about 5 weight %;
phosphoric acid of about 50 weight % to about 77 weight %;
acetic acid of about 1 weight % to about 25 weight %;
acetate compound of about 1 weight % to about 10 weight %;
and water of residual quantity.

2. The composition according to claim 1, wherein the acetate compound includes at least one anion of sodium (Na), potassium (K), ammonia (NH3), calcium (Ca), and aluminum (Al).

3. The composition according to claim 1, wherein the acetate compound is an acid salt.

* * * * *

UNITED STATES PATENT AND TRADEMARK OFFICE
CERTIFICATE OF CORRECTION

PATENT NO. : 7,985,982 B2
APPLICATION NO. : 12/391976
DATED : July 26, 2011
INVENTOR(S) : Bong-Kyun Kim et al.

It is certified that error appears in the above-identified patent and that said Letters Patent is hereby corrected as shown below:

Title Page, item (73) should read:

Assignee(s): Samsung Electronics Co., Ltd.
Gyeonggi-do, Republic of Korea

Techno Semichem Co., Ltd.
Gyeonggi-do, Republic of Korea

Signed and Sealed this
Thirteenth Day of December, 2011

David J. Kappos
*Director of the United States Patent and Trademark Office*